(12) United States Patent
Shimizu et al.

(10) Patent No.: US 8,680,657 B2
(45) Date of Patent: Mar. 25, 2014

(54) LEAD FRAME, SEMICONDUCTOR APPARATUS USING THIS LEAD FRAME, INTERMEDIATE PRODUCT THEREOF AND MANUFACTURING METHOD THEREOF

(75) Inventors: Koji Shimizu, Kitakyushu (JP); Hiroaki Yatsukawa, Kitakyushu (JP)

(73) Assignee: Mitsui High-Tec, Inc., Fukuoka (JP)

( * ) Notice: Subject to any disclaimer, the term of this patent is extended or adjusted under 35 U.S.C. 154(b) by 80 days.

(21) Appl. No.: 13/129,649

(22) PCT Filed: Nov. 24, 2009

(86) PCT No.: PCT/JP2009/069814
§ 371 (c)(1),
(2), (4) Date: May 17, 2011

(87) PCT Pub. No.: WO2010/061826
PCT Pub. Date: Jun. 3, 2010

(65) Prior Publication Data
US 2011/0272793 A1 Nov. 10, 2011

(30) Foreign Application Priority Data
Nov. 25, 2008 (JP) ................................. 2008-299726

(51) Int. Cl.
*H01L 23/495* (2006.01)
(52) U.S. Cl.
USPC ........................................................ 257/666
(58) Field of Classification Search
USPC .......................................... 257/666, E23.142
See application file for complete search history.

(56) References Cited

U.S. PATENT DOCUMENTS

| | | | |
|---|---|---|---|
| 7,049,177 B1 * | 5/2006 | Fan et al. | ...................... 438/123 |
| 7,220,921 B1 | 5/2007 | Sakamoto et al. | |
| 2009/0230525 A1 * | 9/2009 | Chang Chien et al. | ....... 257/676 |

FOREIGN PATENT DOCUMENTS

| | | |
|---|---|---|
| CN | 1213175 | 4/1999 |
| CN | 1323064 | 11/2001 |
| CN | 101267011 | 9/2008 |
| JP | 2001-015668 | 1/2001 |
| JP | 2001-24135 | 1/2001 |
| JP | 2003-174136 | 6/2003 |

OTHER PUBLICATIONS

China Office action, dated Nov. 26, 2012 along with an english translation thereof.

* cited by examiner

*Primary Examiner* — Tran Tran
(74) *Attorney, Agent, or Firm* — Greenblum & Bernstein, P.L.C.

(57) ABSTRACT

In a lead frame for a semiconductor apparatus 10, including plural terminals 13, one portions of the terminals 13 being sealed with a resin, a resin-sealed portion 16 of the terminal 13 has a polygonal columnar shape that is pentagonal or more or a deformed columnar shape having at least one notch or groove part extending vertically in a periphery. This resin-sealed portion 16 is formed by etching processing or press processing, and an exposed portion 18 of lower half of the terminal 13 is formed by the etching processing.

6 Claims, 5 Drawing Sheets

LEAD FRAME, SEMICONDUCTOR APPARATUS USING THIS LEAD FRAME, INTERMEDIATE PRODUCT THEREOF AND MANUFACTURING METHOD THEREOF

TECHNICAL FIELD

The present invention relates to a lead frame used in a semiconductor apparatus for improving adhesion to a sealing resin, the semiconductor apparatus using this lead frame, an intermediate product of the semiconductor apparatus, and a manufacturing method of the lead frame, the semiconductor apparatus and the intermediate product.

BACKGROUND ART

A method in which a region of forming a bonding terminal etc. of a surface of a plate-shaped lead frame material is plated with noble metal and a resist film is formed and etching (first etching) is performed from the front side to about one-half of the thickness and a semiconductor element is mounted and then wire bonding is performed and the lead frame material is sealed with a resin with a back half of the lead frame material left and etching (second etching) is selectively performed from the back side and adjacent terminals are cut off and a semiconductor apparatus is manufactured is disclosed in Patent Reference 1.

PRIOR ART REFERENCE

Patent Reference

Patent Reference 1: JP-A-2001-24135

The semiconductor apparatus manufactured by the method described in Patent Reference 1 is characterized by forming a terminal separated from the plate-shaped lead frame material. Each of the terminals is fixed with a sealing resin and the strength of adhesion between the terminal and the sealing resin depends on the area of contact between the terminal and the sealing resin. A cross section of the terminal normally has a circular shape or a quadrilateral shape. However, because of demands for density growth and miniaturization of the recent semiconductor apparatus, when a thickness of a package or a lead frame is thinned or a standoff (a distance from a bottom surface of the sealing resin to a surface of a mounting substrate) is increased, adhesion between the resin and the terminal decreases, so that the terminal strength is not ensured and the terminal comes out and there was a problem of decreasing reliability of the semiconductor apparatus.

DISCLOSURE OF THE INVENTION

Problems that the Invention is to Solve

The invention has been implemented in view of such circumstances, and an object of the invention is to provide a lead frame capable of obtaining a semiconductor apparatus with high reliability by improving adhesion between a terminal and a sealing resin, the semiconductor apparatus using this lead frame, an intermediate product of the semiconductor apparatus, and a manufacturing method of the lead frame, the semiconductor apparatus and the intermediate product.

Means for Solving the Problems

In order to solve the object, the invention provides the following.

(1) A lead frame for a semiconductor apparatus, comprising plural terminals each having a resin-sealed portion, wherein at least the resin-sealed portion of the terminal has a polygonal columnar shape which is pentagonal or more or a deformed columnar shape having at least one notch or groove part extending vertically in a periphery.

(2) In the lead frame of (1), all the resin-sealed portion has the polygonal columnar shape or the deformed columnar shape.

(3) In the lead frame of (1), the plural terminals sealed with the resin have terminals with the polygonal columnar shape or the deformed columnar shape having two or more kinds of different shapes.

(4) In the lead frame of (1), the terminal has different cross-sectional shapes in the resin-sealed portion and a portion which is not sealed with the resin.

(5) An intermediate product of a semiconductor apparatus having the lead frame of (1). Here, the intermediate product of the semiconductor apparatus refers to a product generated in a process of the case of manufacturing the semiconductor apparatus used as an end product. For example, the intermediate product refers to a product in which a terminal to protrude to the back side is not separated and etching etc. are required in order to separate the plate portion of the back side in a final process using a resist film formed previously.

(6) A semiconductor apparatus having the lead frame of (1).

(7) A manufacturing method of a lead frame including plural terminals each having a resin-sealed portion, at least the resin-sealed portion of the terminal having a polygonal columnar shape that is pentagonal or more or a deformed columnar shape having at least one notch or groove part extending vertically in a periphery, characterized in that the terminals with the polygonal columnar shape or the deformed columnar shape are formed by etching processing or press processing.

(8) In the manufacturing method of the lead frame of (7), all the resin-sealed portion has the polygonal columnar shape or the deformed columnar shape.

(9) In the manufacturing method of the lead frame of (7), the plural terminals sealed with the resin have terminals with the polygonal columnar shape or the deformed columnar shape having two or more kinds of different shapes.

(10) A manufacturing method of an intermediate product of a semiconductor apparatus, comprising an upper side terminal formation step of forming an upper side terminal with a polygonal columnar shape that is pentagonal or more or a deformed columnar shape having at least one notch or groove part extending vertically in a periphery on an upper side of a lead frame material, and an intermediate product formation step of mounting a semiconductor element on an element mounting part of the lead frame material and joining the upper side terminal to an electrode of the semiconductor element by a bonding wire and then sealing the semiconductor element, the bonding wire and the upper side terminal with a resin and manufacturing an intermediate product.

(11) A manufacturing method of a semiconductor apparatus, comprising an upper side terminal formation step of forming an upper side terminal with a polygonal columnar shape that is pentagonal or more or a deformed columnar shape having at least one notch or groove part extending vertically in a periphery on an upper side of a lead frame material, an intermediate product formation step of mounting a semiconductor element on an element mounting part of the lead frame material and joining the upper side terminal to an electrode of the semiconductor element by a bonding wire and then sealing the semiconductor element, the bonding wire and the upper side terminal with a resin and manufacturing an intermediate product, and a terminal separation step of separating a lower side terminal of the intermediate product.

Advantage of the Invention

In the lead frame according to the invention, the semiconductor apparatus using this lead frame, the intermediate product of the semiconductor apparatus, and the manufacturing method of the lead frame, the semiconductor apparatus and the intermediate product, the resin-sealed portion of the terminal has the polygonal columnar shape that is pentagonal or more or the deformed columnar shape having at least the one notch or groove part extending vertically in the periphery, so that the area of contact between the terminal and the resin can be increased. Therefore, even when a thickness of a package or the lead frame is thinned or a standoff is increased, bonding strength of the terminal can be ensured and the terminal can be prevented from coming out. As a result, reliability of the semiconductor apparatus used as a product can be improved.

Also, the invention can be implemented without changing a conventional construction method or step flow by changing a pattern of etching or press, and the bonding strength of the terminal can be improved without adversely affecting the mounting reliability.

Further, in some cases, particularly, the bonding strength of a region with poor adhesion to the sealing resin can be improved partially by changing a shape every separate terminal. Furthermore, shapes of the terminals differ mutually, so that image recognition of the semiconductor apparatus in the case of wire bonding is facilitated and an error of wiring can be prevented.

MODE FOR CARRYING OUT THE INVENTION

Embodiments for embodying the invention will be described with reference to the accompanying drawings.

Figure 1:
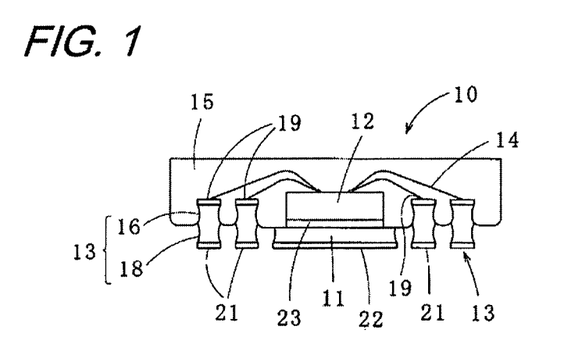
FIG. 1 is a front sectional view of a semiconductor apparatus according to a first embodiment of the invention.
Figure 2:
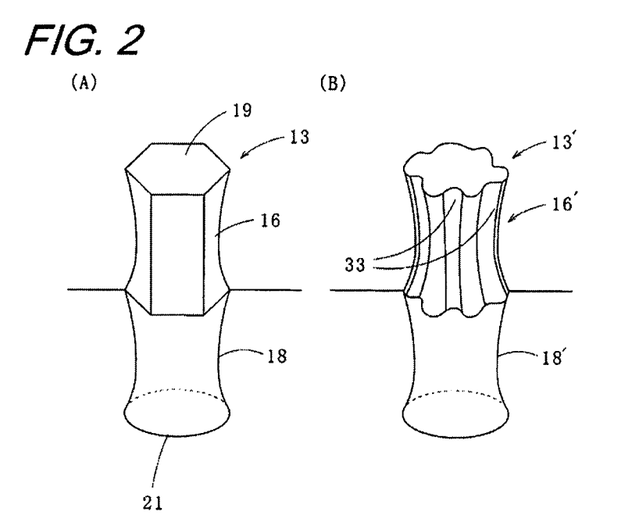
FIG. 2(A) is a perspective view of a terminal of the same semiconductor apparatus.
FIG. 2(B) is a perspective view of a modified example of the terminal.

As shown in FIGS. 1 and 2, a semiconductor apparatus 10 according to a first embodiment of the invention has a semiconductor element 12 placed on an element mounting part 11 of the center, plural terminals 13 arranged in the periphery of the semiconductor element 12, bonding wires 14 for respectively joining surfaces of the terminals 13 to an electrode pad of the semiconductor element 12, and a sealing resin 15 in which substantially upper halves of the terminals 13, the bonding wires 14 and the semiconductor element 12 are sealed with the resin.

Here, a shape of a portion 16 surrounded by the sealing resin 15 of substantially the upper half of the terminal 13 and sealed with the resin is a hexagonal columnar shape (one example of a polygonal columnar shape that is pentagonal or more), and a shape of an exposed portion 18 of substantially the lower half is a circular columnar shape. In addition, as shown in FIG. 2(A), when the portion 16 sealed with the resin is formed by etching, its side surface is also corroded and the vertical center becomes slightly thinner than both vertical ends. Therefore, the polygonal columnar shape herein includes a shape in which the vertical center becomes slightly thinner than both vertical ends as well as the complete polygonal columnar shape.

Thus, in the terminal 13 according to the first embodiment of the invention, the portion 16 sealed with the resin has the polygonal columnar shape, so that the area of contact with the sealing resin 15 increases and the terminal 13 is tightly fixed to the sealing resin 15.

Also, FIG. 2(B) shows a terminal 13' according to a modified example. The terminal 13' according to the modified example has a deformed columnar shape in which groove parts 33 made of plural concave parts and convex parts extending vertically are formed in the periphery of a portion 16' sealed with a resin. Also in this modified example, by forming the portion 16' sealed with the resin by etching, its side surface is also corroded and the vertical center becomes slightly thinner than both vertical ends. In addition, numeral 18' is an exposed portion of a circular columnar shape of the terminal 13'.

In addition, on an upper surface (front surface) 19 of the terminal 13 used as a wire bonding part, for example, a nickel-plated layer is plated with gold (one example of noble metal plating), and also on lower surfaces (bottom surfaces) 21, 22 of the terminal 13 and the element mounting part 11, for example, a nickel-plated layer is plated with gold (one example of noble metal plating). Also, in this semiconductor apparatus 10, a thickness of the element mounting part 11 is about one-half of a thickness of the terminal 13 and the semiconductor element 12 is mounted through a conductive adhesive 23.

Figure 3:
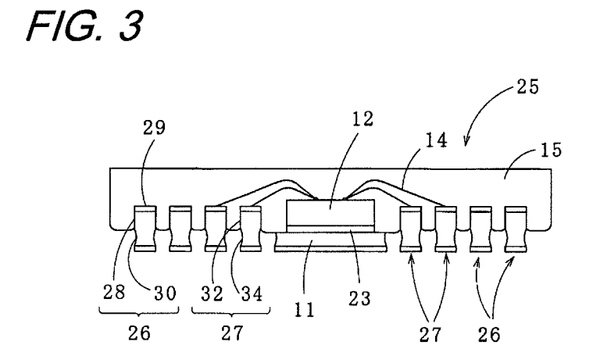
FIG. 3 is a front sectional view of a semiconductor apparatus according to a second embodiment of the invention.
Figure 4:
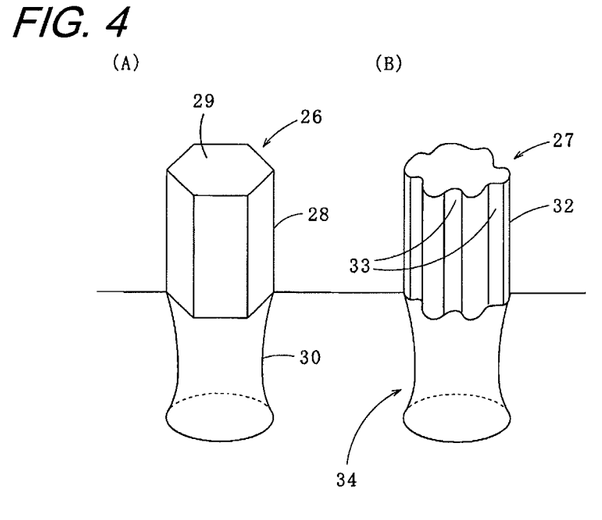
FIG. 4 is a perspective view of a terminal of the same semiconductor apparatus.

Subsequently, a semiconductor apparatus 25 according to a second embodiment shown in FIGS. 3 and 4 will be described. The semiconductor apparatus 25 according to the second embodiment differs from the semiconductor apparatus 10 according to the first embodiment in that terminals 26, 27 are arranged in four lines on one side and the terminals 26, 27 with different shapes are had, so that the detailed explanation is omitted by assigning the same numerals to the same components (the same applies hereinafter). A resin-sealed portion 28 of the terminal 26 used in this semiconductor apparatus 25 has a hexagonal columnar shape, and a shape of a hexagon of an upper surface 29 is the same as a cross-sectional shape of the resin-sealed portion 28. That is, unlike the first embodiment, the resin-sealed portion 28 has a constant thickness. The terminal 27 has a deformed columnar shape in which groove parts 33 made of plural concave parts and convex parts extending vertically are formed. Shapes of exposed portions 30, 34 are circular shapes in cross section and like the first embodiment, the vertical center becomes slightly thinner than both vertical ends.

Thus, in one lead frame and the semiconductor apparatus 25 using this lead frame, the cross-sectional shapes of the resin-sealed portions 28, 32 of the terminals 26, 27 can be changed to form the terminals with two or more kinds of different shapes in a polygonal columnar shape or the deformed columnar shape, and a shape of a wire bonding part can be changed according to use.

Figure 5:
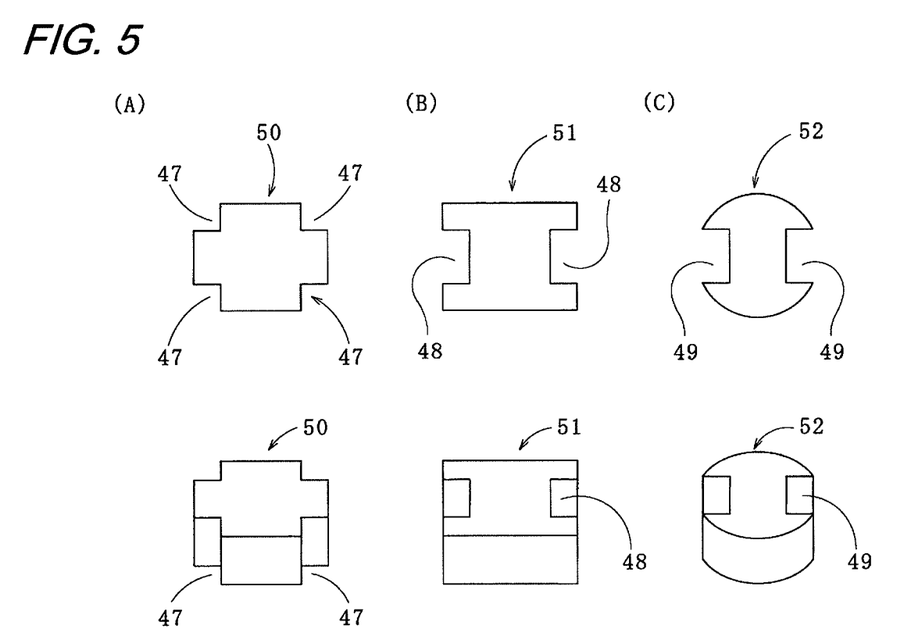
FIGS. 5(A) to 5(C) are bottom views and perspective views of resin-sealed portions of the terminals of the semiconductor apparatus according to modified examples of the first and second embodiments of the invention.

In addition, in the terminals 13, 26, 27, the shapes of the resin-sealed portions 16, 28, 32 are not limited to the shapes illustrated in the semiconductor apparatus 10, 25 shown above. Any shape can be applied as long as the terminals 13, 26, 27 have a predetermined terminal height and a predetermined terminal pitch and a cross-sectional length of the periphery is longer than a length of the periphery of a circular shape or a quadrilateral shape. Since such a configuration can increase the area of contact between the terminal and the resin, adhesion between the sealing resin 15 and the terminals 13, 26, 27 improves. It is preferable to form notches or groove parts 47 as shown in FIG. 5(A) or concave parts (or groove parts) 48, 49 as shown in FIGS. 5(B) and 5(C) in the periphery. In addition, in FIG. 5, numerals 50, 51, 52 respectively show only resin-sealed portions and omit exposed portions. By being formed thus, adhesion to the sealing resin 15 improves further.

Also, the cross-sectional shapes of the exposed portions 18, 30, 34 are the circular shapes, but the invention is not limited to the circular shape, and any shape having a concave part or a convex part in the periphery, an oval shape, an elliptic shape, a polygonal shape including a triangular shape or a quadrilateral shape may be used.

Figure 6:
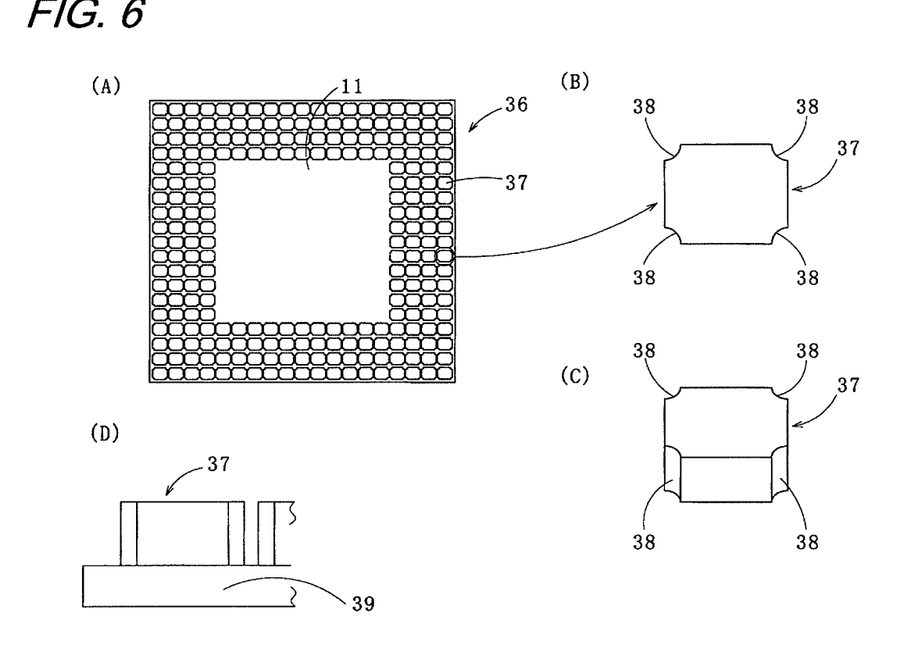
FIG. 6(A) is a surface view of a lead frame used in a semiconductor apparatus according to a third embodiment of the invention.
FIG. 6(B) is an enlarged plan view of a terminal of the same lead frame.
FIG. 6(C) is an enlarged perspective view of the terminal of the same lead frame.
FIG. 6(D) is an enlarged side view of corners of the same lead frame.

FIG. 6 shows a lead frame 36 (material is copper or copper alloy) used in a semiconductor apparatus according to a third embodiment. As shown in FIG. 6(A), in the lead frame 36, terminals 37 sealed with a resin are arranged in an area array shape around an element mounting part 11. As shown in FIGS. 6(B) and 6(C), the terminal 37 sealed with the resin has a deformed columnar shape formed by disposing circular arc (quadrant) notches 38 in the corners of the terminal 37 whose cross section has a rectangular shape. In addition, in this embodiment, an exposed portion of the lead frame 36 is not formed, so that the lead frame 36 is formed in a flat plate 39 as shown in FIG. 6(D). Then, after a semiconductor element 12 is mounted on the element mounting part 11 of the center, wire bonding is performed, and the semiconductor element 12, bonding wires 14 and the terminals 37 are sealed with the resin and an intermediate product is formed. Thereafter, etching for separating each of the terminals 37 from the back side is performed and the semiconductor apparatus is completed.

Figure 7:
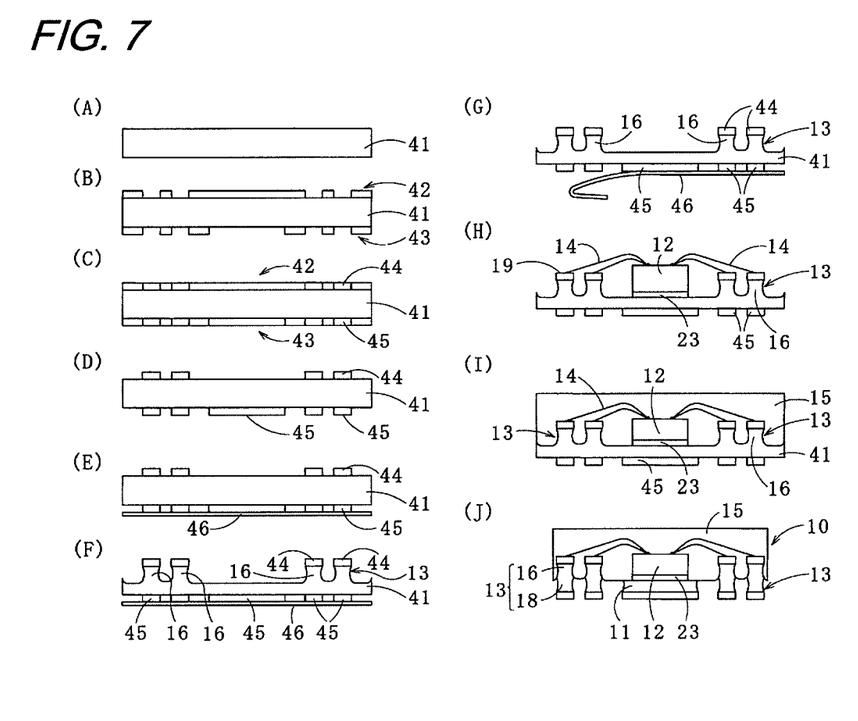
FIG. 7 is a step explanatory diagram of a manufacturing method of a semiconductor apparatus according to one embodiment of the invention.

Subsequently, a manufacturing method of the semiconductor apparatus 10 using the lead frame according to one embodiment of the invention will be described with reference to FIG. 7. As shown in FIG. 7(A), a plate-shaped lead frame material 41 is prepared and as shown in FIG. 7(B), a pattern 42 of an upper surface 19 of a terminal 13 and a pattern 43 having a lower surface 21 of the terminal 13 and a lower surface 22 of an element mounting part 11 are formed on the front and back of the lead frame material 41. In addition, in this embodiment, one semiconductor apparatus is described for ease of explanation, but plural semiconductor apparatuses are actually arranged and formed in a matrix in one lead frame material 41.

Here, a shape of a space part (that is, a portion of the absence of the pattern) of the pattern of the upper surface 19 of the terminal 13 is formed in a polygonal (pentagonal or more) shape rather than a circular shape or a quadrilateral shape, or a shape (that is, a region in which a wire bonding part is formed) having one or more notches or groove parts in the periphery.

Next, as shown in FIG. 7(C), etching-resistant plating (normally, noble metal plating) 44, 45 is performed after base plating (normally, nickel plating) is performed using the patterns 42, 43. In addition, it is unnecessary to plate a back surface of the lead frame material 41 with noble metal as long as etching from the back surface can be resisted, and the back surface may be plated with, for example, nickel plating or tin plating. Therefore, the etching-resistant plating 44 is performed in the polygonal (pentagonal or more) shape, or the shape having one or more notches or groove parts in the periphery.

Then, as shown in FIG. 7(D), resist films of the front and back are removed and the etching-resistant plating 44, 45 is left and the lead frame material 41 is exposed. Then, as shown in FIG. 7(E), a cover sheet (an etching-resistant film) 46 is stuck on the back surface of the lead frame material 41, and the back surface of the lead frame material 41 is prevented from being corroded by an etching solution.

As shown in FIG. 7(F), half etching (first etching) is performed on the front side of the lead frame material 41 and portions 16 (upper half of the terminal 13, upper side terminals) sealed with a resin are formed. Then, as shown in FIG. 7(G), the cover sheet 46 is removed. In addition, the cover sheet 46 may be removed at any time before etching (second etching) of the second time. The lead frame is manufactured in the step so far.

Thereafter, as shown in FIG. 7(H), a semiconductor element 12 is mounted on the center of the element mounting part 11 formed by half etching the lead frame material 41 through a conductive adhesive 23, and wire bonding between an electrode pad of the semiconductor element 12 and the wire bonding parts formed on the upper surfaces 19 of the terminals 13 of the periphery is performed.

Then, as shown in FIG. 7(I), upper half of the lead frame material 41, that is, the resin-sealed portions 16 of the terminals 13, bonding wires 14 and the semiconductor element 12 are sealed with the resin. Each of the terminals 13 is connected by the flat plate of lower side half, and an intermediate product in the invention is formed.

Then, as shown in FIG. 7(J), lower half of the lead frame material 41 is etched (second etching) and exposed portions 18 (lower side terminals) are formed in the terminals 13 and each of the terminals 13 is electrically separated. Consequently, the semiconductor apparatus 10 shown in FIG. 1 is formed.

In addition, in the embodiments described above, all the portion 16 sealed with the resin (that is, the upper end to the lower end of the resin-sealed portion of the terminal 13) has the polygonal columnar shape or the deformed columnar shape and the portion exposed from the sealing resin 15 has the circular columnar shape, but all the terminal 13 (from the upper end to the lower end) including a portion which is not sealed with the resin can also have the polygonal columnar shape or the deformed columnar shape.

Also, after the step of FIG. 7(J), resin coating, electroless plating, etc. can be performed in order to protect the exposed terminal 13 from oxidation. Further, in the embodiments, the resin-sealed portion 16 of the terminal 13 is formed by etching processing, but can also be formed by press processing. In this case, the resin-sealed portion of the terminal has substantially a constant thickness as described in the semiconductor apparatus 25 according to the second embodiment.

Also, in the embodiments, the upper portion of the element mounting part is etched half, but the embodiments are not limited to this form, and by the first etching, the element mounting part is not etched half and may be left at the same height as the terminal. In this case, the periphery of the element mounting part is also formed in the same shape as the periphery of the terminal. Consequently, adhesion between the element mounting part and the sealing resin increases and reliability improves further.

The invention has been described in detail with reference to the specific embodiments, but it is apparent to those skilled in the art that various changes or modifications can be made without departing from the spirit and scope of the invention.

The present application is based on Japanese patent application (patent application No. 2008-299726) filed on Nov. 25, 2008, and the contents of the patent application are hereby incorporated by reference.

Industrial Applicability

According to a lead frame according to the invention, the area of contact between a terminal and a resin can be increased, so that even when a thickness of a package or the lead frame is thinned or a standoff is increased, strength of the terminal can be ensured and the terminal can be prevented from coming out. As a result, reliability of a semiconductor apparatus used as a product can be improved.

DESCRIPTION OF REFERENCE NUMERALS AND SIGNS

10 SEMICONDUCTOR APPARATUS
11 ELEMENT MOUNTING PART
12 SEMICONDUCTOR ELEMENT
13, 13' TERMINAL
14 BONDING WIRE
15 SEALING RESIN
16,16' PORTION SEALED WITH RESIN
18,18' EXPOSED PORTION
19 UPPER SURFACE
21,22 LOWER SURFACE
23 CONDUCTIVE ADHESIVE
25 SEMICONDUCTOR APPARATUS
26,27 TERMINAL
28 PORTION SEALED WITH RESIN
29 UPPER SURFACE
30 EXPOSED PORTION
32 PORTION SEALED WITH RESIN
33 GROOVE PART
34 EXPOSED PORTION
36 LEAD FRAME
37 TERMINAL
38 NOTCH
39 FLAT PLATE
41 LEAD FRAME MATERIAL
42,43 PATTERN
44,45 ETCHING-RESISTANT PLATING
46 COVER SHEET
47 GROOVE PART
48,49 CONCAVE PART (OR GROOVE PART)
50,51,52 PORTION SEALED WITH RESIN

The invention claimed is:

1. A lead frame for a semiconductor apparatus, comprising:
plural terminals each having a resin-sealed portion, wherein at least the resin-sealed portion of at least one of the terminals has a deformed columnar shape having an upper end surface and at least one notch or groove part extending vertically from the upper end surface in a periphery.

2. A lead frame as claimed in claim 1, wherein an entirety of the resin-sealed portion has the polygonal columnar shape or the deformed columnar shape.

3. A lead frame as claimed in claim 1, wherein the plural terminals sealed with the resin have terminals with the polygonal columnar shape or the deformed columnar shape having two or more kinds of different shapes.

4. A lead frame as claimed in claim 1, wherein the terminal has different transverse cross-sectional shapes in the resin-sealed portion and a portion which is not sealed with the resin.

5. An intermediate product of a semiconductor apparatus having the lead frame as claimed in claim 1.

6. A semiconductor apparatus having the lead frame as claimed in claim 1.

* * * * *

UNITED STATES PATENT AND TRADEMARK OFFICE
CERTIFICATE OF CORRECTION

PATENT NO. : 8,680,657 B2  
APPLICATION NO. : 13/129649  
DATED : March 25, 2014  
INVENTOR(S) : K. Shimizu et al.

Page 1 of 1

It is certified that error appears in the above-identified patent and that said Letters Patent is hereby corrected as shown below:

On the Title Page, item [57] Abstract, Column 2, line 2 of the printed patent, please change "portions" to --portion--.

Signed and Sealed this  
Ninth Day of December, 2014

Michelle K. Lee  
*Deputy Director of the United States Patent and Trademark Office*